United States Patent [19]
Best

[11] Patent Number: 5,748,031
[45] Date of Patent: May 5, 1998

[54] ELECTRICAL LASER FUSE HYBRID CELL

[75] Inventor: Scott C. Best, Sunnyvale, Calif.

[73] Assignee: Cypress Semiconductor, Corporation, San Jose, Calif.

[21] Appl. No.: 595,545

[22] Filed: Feb. 1, 1996

[51] Int. Cl.$^6$ .................. G11C 7/00; H01H 37/76
[52] U.S. Cl. ............................ 327/525; 327/526
[58] Field of Search ........................ 327/525, 526; 326/10, 14; 365/96, 225.7

[56] References Cited

U.S. PATENT DOCUMENTS

| | | | |
|---|---|---|---|
| 4,686,384 | 8/1987 | Harvey et al. | 327/525 |
| 5,151,611 | 9/1992 | Rippey | 327/525 |
| 5,508,638 | 4/1996 | Cowles et al. | 326/38 |
| 5,548,555 | 8/1996 | Lee et al. | 365/200 |
| 5,566,107 | 10/1996 | Gilliam | 327/525 |

Primary Examiner—Toan Tran
Assistant Examiner—T. T. Lam
Attorney, Agent, or Firm—Oblon, Spivak, McClelland, Maier & Neustadt, P.C.

[57] ABSTRACT

A programmable hybrid fuse circuit having a laser fuse and an electrical fuse. The programmable hybrid fuse circuit includes a reference circuit, a current mirror and at programming circuit. The reference circuit generates a reference current mirror. The current mirror generates an output current in response to the reference current. The current mirror has at least one current output which is coupled to a programming circuit to receive the output current. The programming circuit includes a laser fuse and an electrical fuse coupled in a serial order such that either the laser fuse or the electrical fuse is capable of being blown during programming. The programming circuit generates an output signal having a first voltage level or a second voltage level dependent on whether one of the fuses is blown during programming.

19 Claims, 3 Drawing Sheets

ELECTRICAL LASER FUSE HYBRID CELL

BACKGROUND OF THE INVENTION

1. Field of the Invention

The present invention relates to the field of Semiconductor Integrated Circuits. More specifically, this invention relates to fuses in Integrated Circuits.

2. Prior Art

Fuses are often used to adjust the performance of a Semiconductor Integrated Circuit after the fabrication of the circuit. Two common types of fuses are the electrical fuse and the laser fuse. Both the electrical fuse and the laser fuse are typically connected, until ruptured by either a laser beam in the case of a laser fuse, or an electrical pulse in the case of the an electrical fuse when adjusting the performance of the circuit. The laser fuses and electrical fuses are most often implemented with a polysilicon resistor and may be implemented with other structures such as metal traces or zener diodes. Typically, laser fuses are considered to be more reliable than electrical fuses and electrical fuses are considered to be more cost efficient than laser fuses. Therefore, laser fuses are more desirable in certain situations while electrical fuses are more desirable in other situations.

Generally, once a laser fuse is blown up by a laser beam, the laser fuse is known to be broken. On the other hand, once an electrical fuse is blown up by an electrical pulse, the electrical fuse is not absolutely guaranteed to be broken and furthermore, it is possible that a broken electrical fuse will be reconnected by a phenomena called polysilicon regrowth.

Although laser fuses are generally more reliable than electrical fuses, laser fuses have several drawbacks. First of all, each laser fuse on the die requires an alignment target which is used by the scanner on the programming equipment to locate the laser fuse on the die. Typically, the entire alignment target on the die is shown by a clearly defined pattern in the metal, where each alignment target utilizes a substantial amount of die space. The die space required for each alignment target is approximately the same size as the die space used for an input/output pad. Thus, one of the drawbacks of using a laser fuse is the amount of die space required for the alignment target.

The second drawback of using a laser fuse is that the testing and the programming of laser fuses requires two insertions into two different types of machines during the production testing of the integrated circuit. This procedure is often referred to as the double insertion procedure because the wafer is first inserted into a test machine which measures the performance of the wafer, and then inserted into a programming machine which applies a laser beam to those laser fuses specified to be broken. On the other hand, electrical fuses requires only one machine to test and program the electrical fuses. One disadvantage of a double insertion procedure, rather than a single insertion procedure, is that two machines are required to test and program the laser fuses. In addition to the expense of acquiring and operating two different types of machines, the production throughput time of the wafers is increased, which typically raises the production cost.

Another drawback of using a laser fuse over an electrical fuse is that the laser fuse must be broken before the die is packaged. Once the die is packaged, laser beams do not have the ability to penetrate the package in order to sever the laser fuse. Thus, the programming of the laser fuse is limited to the pre-packaging of the integrated circuit. On the other hand, electrical fuses use bonding pad structures to interface with the fuse "zapping" equipment. These pads can be bonded out to the package, thereby providing the flexibility of programming the electrical fuse either before or after the device is packaged.

As mentioned above, a significant advantage of using electrical fuses over laser fuses is the reduced production cost of the integrated circuit. Another advantage of the electrical fuse over the laser fuse is that the support structure required for the electrical fuses enables a packaged device to be programmed after the integrated circuit is packaged. However, a drawback of using electrical fuses over laser fuses is the uncertainty related to blowing the electrical fuses which may affect the reliability of the integrated circuit. In other words, when an electrical pulse is applied to an electrical fuse, it is not guaranteed that the electrical pulse is strong enough to fully break the fuse or that a broken fuse will not later reconnect as a result of polysilicon regrowth.

In the prior art, a fuse circuit was implemented with either laser fuses or electrical fuses. In other words, both fuse technologies were not used in the same fuse circuit or even on the same integrated circuit. FIG. 1 illustrates the prior art laser fuse 100 and an electrical fuse 110 with its associated support structure. The electrical fuse 110 is coupled to pads 120 and 130 via metal connects 125 and 135, respectively, to enable an electrical pulse to be applied to the electrical fuse 110. When laser fuses are used in an integrated circuit, the user is limited to the advantages and disadvantages associated with laser fuses and likewise, when electrical fuses are used in a circuit, the user is limited to the advantages and disadvantages associated with electrical fuses.

Therefore, the present invention provides a hybrid fuse structure that incorporates both a laser fuse and an electrical fuse. The hybrid fuse structure provides added flexibility by allowing the user to select whether he or she prefers the advantages and disadvantages associated with a laser fuse or an electrical fuse. For instance, by combining a laser fuse and an electrical fuse in one fuse circuit, the user may choose to program the laser fuses during the prototyping phase of the integrated circuit and choose to program the electrical fuses during the production phase of the integrated circuit. Typically, during the prototyping phase, the designer is much more concerned with the reliability of his or her design rather than the production throughput time. But once the design reaches the production phase, the reduction of the manufacturing cost becomes a significant concern for the manufacturer.

SUMMARY OF THE INVENTION

It is desirable to provide a fuse circuit having both a laser fuse and an electrical fuse serially coupled.

It is desirable to select the use of either the laser fuse or the electrical fuse during programming.

It is desirable to provide a hybrid fuse circuit that can be programmed to generate a digital output.

The present invention provides an apparatus for a hybrid fuse circuit having both a laser fuse and an electrical fuse. The hybrid fuse circuit includes a reference circuit, a current mirror and a programming circuit. The reference circuit generates a reference current for the current mirror. The current mirror's input is coupled to the reference circuit and its output is coupled to the programming circuit. In response to the reference current generated by the reference circuit, the current mirror generates a current that is supplied to the programming circuit. The programming circuit includes a laser fuse and an electrical fuse coupled in a serial order such that either the laser fuse or the electrical fuse is capable of being blown during programming. The programming circuit has two possible output signals: a first voltage level if either the laser fuse or the electrical fuse is blown during programming and a second voltage level if neither of the fuses are blown during programming.

The present invention also provides a method for programming a hybrid fuse circuit. The programmer first determines whether to program the laser fuse or the electrical fuse in the hybrid fuse circuit. Next, the hybrid fuse circuit is programmed by blowing either the laser fuse or the electrical fuse. Lastly, the hybrid fuse circuit generates an output signal.

BRIEF DESCRIPTION OF THE DRAWINGS

The present invention is illustrated by way of example and not limitation in the figures of the accompanying drawings, in which like references indicate similar elements and in which.

DETAILED DESCRIPTION OF THE INVENTION

Figure 4:
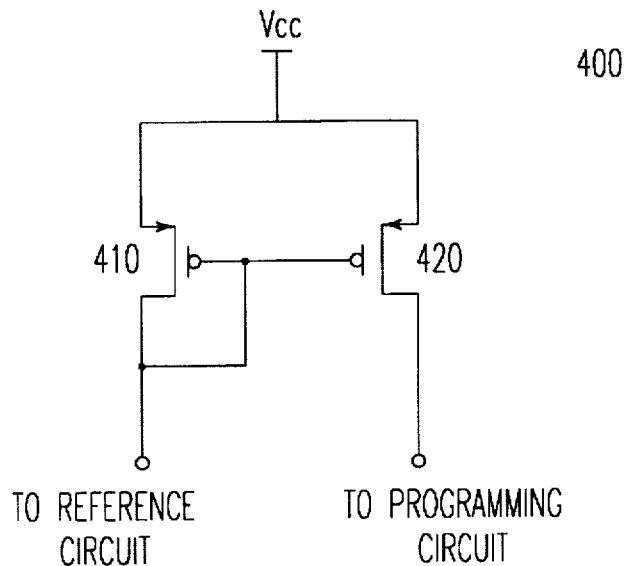
FIG. 4 illustrates on embodiment of a current mirror in the present invention.
Figure 1A:
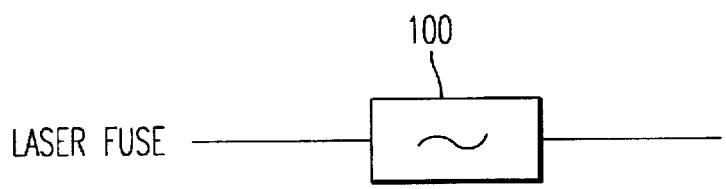
FIG. 1 illustrates the prior art laser fuse and electrical fuse.
Figure 1B:
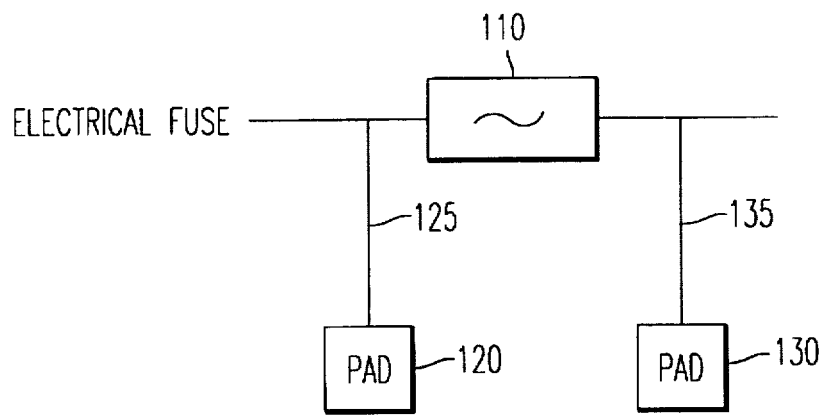

The following detailed description sets forth an embodiment or embodiments in accordance with the present invention for a method and apparatus for a programmable hybrid fuse circuit. In the following description, details are set forth such as specific circuitry configurations, in order to provide a thorough understanding of the present invention. It will be evident, however, that the present invention may be practiced without these details. In other instances, the functioning of well-known circuit components, logic gates, etc., have not been described in particular detail so as not to obscure the present invention.

The present invention provides a programmable hybrid fuse circuit having both a laser fuse and an electrical fuse. By combining the laser fuse technology with the electrical fuse technology, the programmer has two options when programming the integrated circuit. The first option during programming is to rupture the laser fuse with a laser beam, and the second option during programming is to rupture the electrical fuse with an electrical pulse. The programming of laser fuses, in comparison to the programming electrical fuses, increases both the production throughput time and cost. Therefore, from the production standpoint, laser fuses are typically less desirable. However, the programming of electrical fuses, in comparison to the programming of the laser fuses, does not guarantee that the fuse has actually been severed or will remain severed. Therefore, from the reliability standpoint, electrical fuses are typically less desirable. By providing a fuse circuit utilizing both types of fuse technologies, the programmer has the flexibility of selecting which technology he or she prefers based upon the advantages and disadvantages associated with each technology.

The programmable hybrid fuse circuit of the present invention can be used in data communication and other applications that require a precise voltage threshold. For example, the programmable hybrid fuse circuit can be used to adjust the voltage in a bandgap device or in a carrier sense threshold device in an Ethernet Coaxial Transceiver. Typically, an Ethernet Coaxial Transceiver receives an input data signal having an amplitude $V_A$, which is a specified IEEE standard. The carrier sense threshold device is coupled to the bandgap device to receive a reference voltage, $V_{BANDGAP}$, which is used by the carrier sense threshold device to generates the threshold voltage $V_T$. The carrier sense threshold device compares the amplitude $V_A$ of the data input signal with the threshold voltage $V_T$. If the amplitude $V_A$ of the input data signal is not above the threshold voltage $V_T$, the carrier sense threshold device does not pass the input data signal. On the other hand, if the amplitude $V_A$ of the input data signal is greater than the threshold voltage $V_T$, then the carrier sense threshold device passes the input data signal.

During the testing of the transceiver, if an input signal, having amplitude $V_A$ lower than the threshold voltage $V_T$, passes through the carrier sense threshold device, than the reference voltage generated by the bandgap device is adjusted such that only input signals having the required amplitude $V_A$ pass through the carrier sense threshold device. Alternatively, adjustments are made to the carrier sense threshold to adjust the ratio of the bandgap voltage $V_{BANDGAP}$ to the threshold voltage $V_T$. These adjustments are made during programming by blowing the appropriate fuse circuits located in either the carrier sense threshold device or the bandgap device. Thus, a circuit (e.g. Ethernet Coaxial Transceiver) having a precise voltage threshold is implemented.

Figure 2:
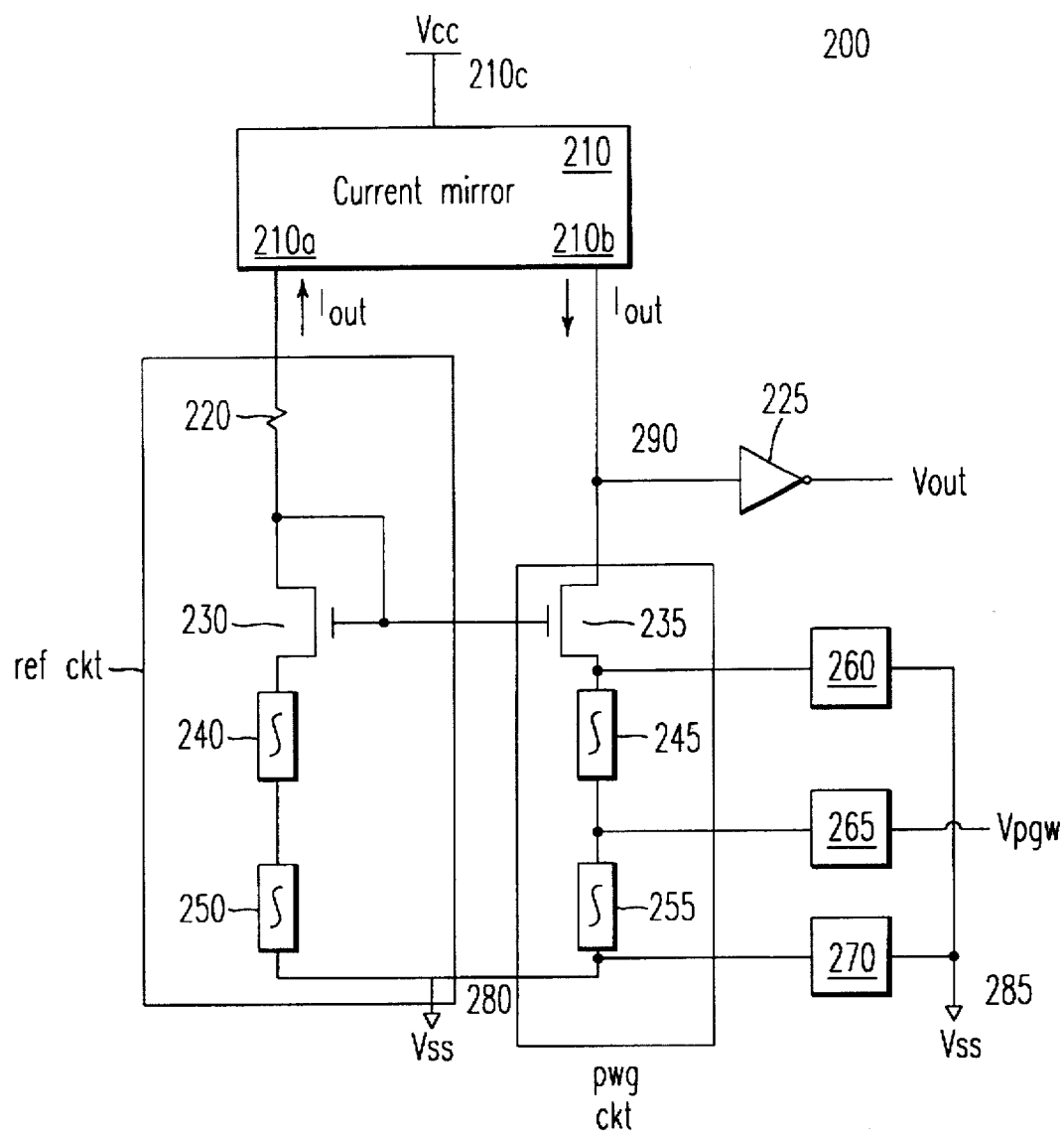
FIG. 2 illustrates on embodiment of the programmable hybrid fuse circuit of the present invention.

FIG. 2 illustrates one embodiment of the programmable hybrid fuse circuit of the present invention. The programmable hybrid fuse circuit 200 includes a current mirror 210 that couples a reference circuit at input 210a to a programming circuit at output 210b. In one embodiment, Vcc is at 5 volts. The current mirror 210 generates an output current $I_{OUT}$ at output 210b in response to the reference current set up by the reference circuit. FIG. 4 illustrates one implementation of a current mirror with a gain of 0.5. The current mirror 400 includes two p-channel MOS transistors 410 and 420 having a ratio of 2:1. The source of transistors 410 and 420 are both coupled to a voltage terminal at Vcc. The gates of MOS transistors are coupled together and to the drain of MOS transistor 410 which is coupled to the reference circuit. The drain of the MOS transistor 420 is coupled to the programming circuit. It is appreciated that the current mirror 210 can be implemented in other ways known to those skilled in the art.

Referring back to FIG. 2, the reference circuit includes the resistor 220, the n-channel MOS (metal oxide semiconductor) transistor 230, the laser fuse 240 and the electrical fuse 250. According to FIG. 2, the input 210a of the current mirror 210 is coupled to the drain and the gate of the transistor 230 via the resistor 220. Furthermore, the source of the transistor 230 is coupled to a voltage terminal 280 at Vss via the laser fuse 240 and the electrical fuse 250. In one embodiment, Vss is at 0 volts. As long as the laser fuse 240 and the electrical fuse 250 are serially coupled, it is irrelevant which one of the two fuses is coupled to the source of transistor 230, and which one of the two fuses is the voltage terminal 280.

The reference circuit sets up the reference current for the current mirror 210. The reference current $I_{ref}$ can be calculated from the following equation:

$$I_{ref} = \frac{V_{cc} - V_{in} - V_{GS}}{R_{bias} - R_{electrical} - R_{laser}},$$

where Vcc is the voltage at voltage terminal 210c, $V_{in}$ is the voltage across the input 210a of the current mirror 210, $V_{GS}$ is the voltage across transistor 230 and Vss is assumed to be at ground. Furthermore, $R_{bias}$, $R_{electrical}$ and $R_{laser}$ represent the resistive values of the resistor 220, the laser fuse 240, and the electrical fuse 250.

The programming circuit receives the output current $I_{out}$ from the current mirror 210. In one embodiment of the present invention, the output current $I_{out}$ is one-half the current of the reference current $I_{ref}$. In other words, the current mirror 210 has a 2:1 ratio of the reference current $I_{ref}$ to the output current $I_{out}$, or Gain=0.5. The programming circuit includes an n-channel MOS transistor 235, a laser fuse 245 and an electrical fuse 255. The transistor 235 has a drain which is coupled to the output 210b of the current mirror 210, a gate which is coupled to the gate of transistor 230, and a source coupled to the laser fuse 245. The drain of the transistor 235 is also coupled to the output of the programmable hybrid fuse circuit 200 via an inverter 225. The inverter 225 senses whether a fuse has been blown or not, and drives the digital output signal. The laser fuse 245 and the electrical fuse 255 are serially coupled with one end of the laser fuse coupled to transistor 235 and one end of the electrical fuse is coupled to the voltage terminal 280 at Vss. As long as the laser fuse 245 and the electrical fuse 255 are serially coupled, it is irrelevant which one of the two fuses is coupled to the source of transistor 235, and which one of the two fuses is the voltage terminal 280. The transistor 235 is approximately the same size as transistor 230 in the reference circuit. Furthermore, the laser fuse 245 has approximately the same resistive value as the laser fuse 240 in the reference, and the electrical fuse 255 has approximately the same resistive value as the electrical fuse 250 in the reference circuit.

Assuming that Vcc is at 5 volts, Vss is at 0 volts, the resistor 220 can be chosen such that the reference current $I_{ref}$=1 mA (milliamps). With the programmable fuses 245 and 255 intact, 0.5 mA of current flows from the output 210b of the current mirror into node 290. Since the bottom half of the programming circuit is identical to the bottom half of the reference circuit in terms of the transistor sizes and the resistive values, the transistor 235 attempts to draw from node 290 the same amount of current that is drawn from the bottom half of the reference circuit. In this example, $I_{ref}$=1 mA such that the bottom half of the programming circuit attempts to draw 1 mA of current from node 290, although only 0.5 mA of current flows into node 290 from the current mirror. As the transistor 235 is trying to pull more current than the output of the current mirror 210b will supply, the voltage terminal 280, the voltage at node 290 is pulled down towards ground such that the inverter will see a logic "0" at its input. Thus, the output voltage $V_{out}$ of the programmable hybrid fuse circuit outputs a logic "1". Therefore, when both the laser fuse 245 and the electrical fuse 255 are left intact (i.e. connected) then the programming circuit provides an output signal having a "high" voltage level.

In order for the programmable hybrid fuse circuit 200 to generate an output signal having a "low" voltage level, either the laser fuse 245 or the electrical fuse 255 must be broken. When one of the fuses is broken, the bottom half of the programming circuit operates as an open circuit such that no current is drawn away from the node 290 by the transistor 235. As a result of 0.5 mA of current flowing into node 290, without any current being pulled from the node 290, the voltage at the node 290 is pulled up towards Vcc. Therefore, when either the laser fuse 245 or the electrical fuse 255 is broken, then the logic "1" at node 290 is inverted by inverter 255 to generate an output signal having a "low" voltage level.

The programmable hybrid fuse circuit 200 can be programmed by blowing either the laser fuse 245 or the electrical fuse 255. As mentioned above in the background, a laser fuse is blown by applying a laser beam directly to the laser fuse and an electrical fuse is blown by applying an electrical pulse to the electrical fuse. Typically, an electrical fuse is blown by applying a 30 volt electrical pulse to the electrical fuse. In order to apply an electrical pulse to the electrical fuse, a support structure is coupled to the programming circuit. In one embodiment, the support structure includes the input and/or output pads 260, 265 and 270. The laser fuse 245 is coupled to the pad 260 at one end and the pad 265 at the other end. The electrical fuse 255 is coupled to the pad 265 at one end and the pad 270 at the other end. When programming the electrical fuse 255, a programming signal Vpgm having a high voltage at approximately 30 volts is applied to the pad 265, and Vss is applied to the pads 260 and 270. Therefore, when the electrical pulse generated by the programming signal Vpgm is received by the electrical fuse 255, the electrical fuse is blown. Typically, the electrical fuse has a physical structure different than the laser fuse which makes the electrical fuse more likely to be blown when hit with an electrical pulse while the laser fuse remains intact. However, this physical dissimilarity is not required. Since the electrical fuse and laser fuse are connected serially, it does not make a difference to the performance of the circuit which one of the two fuses is broken. Note also, that pads 250 and 270 are coupled to ground during programming to prevent damaging transistor 235.

Figure 3:
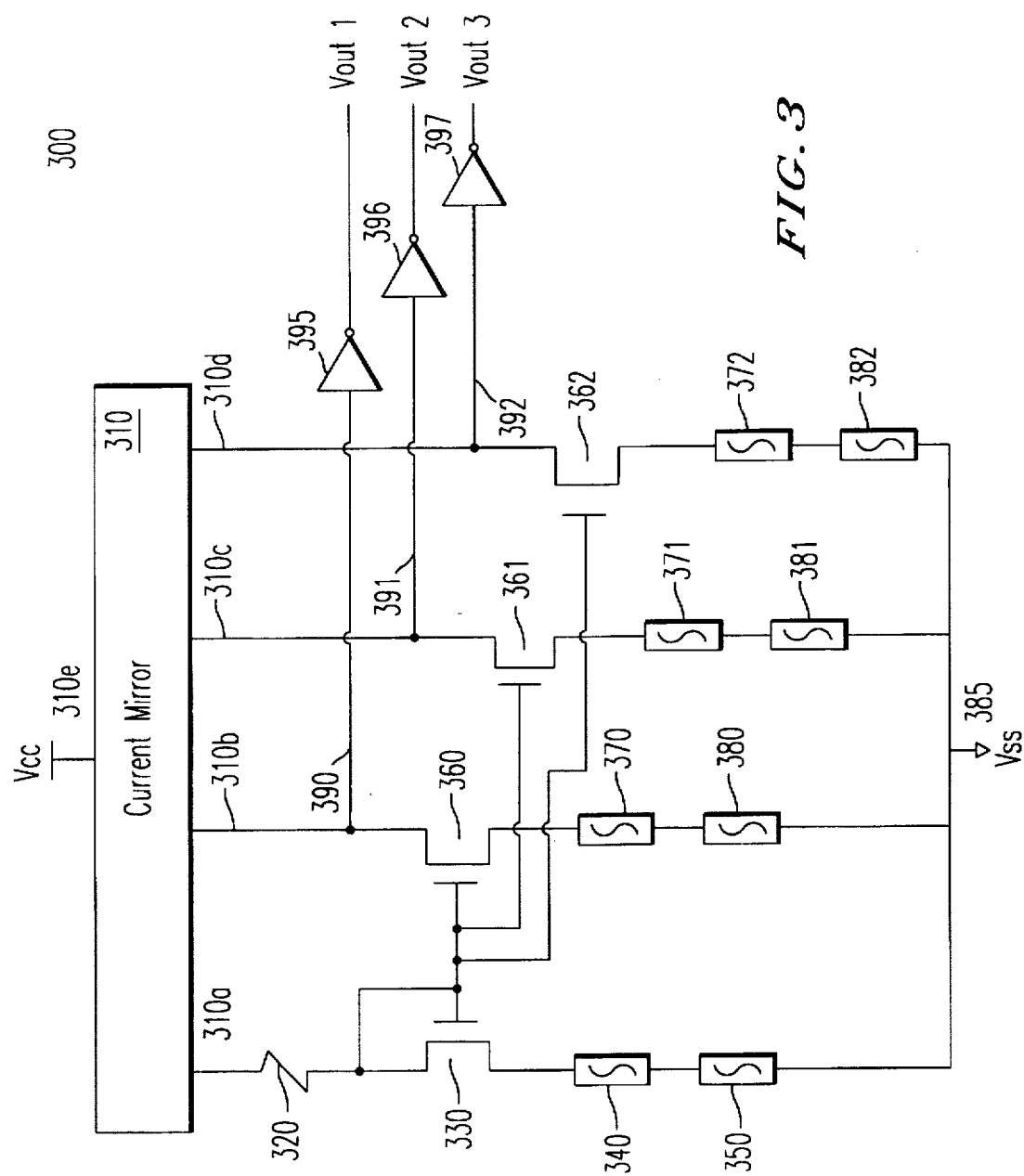
FIG. 3 illustrates another embodiment for the programmable hybrid fuse circuit of the present invention.

FIG. 3 is an embodiment of the present invention that generates three output voltage signals $V_{out1}$, $V_{out2}$ and $V_{out3}$. The programmable hybrid fuse circuit 300 includes a reference circuit that sets up a reference current, a current mirror that generates three output currents in response to the reference current, and three programming circuits for receiving the output currents from the current mirror and for providing the three output voltage signals $V_{out1}$, $V_{out2}$ and $V_{out3}$. In one embodiment, the three output currents generated by the current mirror 310 is one-half the reference current. The input 310a of the current mirror 310 is coupled to the reference circuit, the output 310b of the current mirror 310 is coupled to the first programming circuit, the output 310c of the current mirror 310 is coupled to the second programming circuit, and the output 310d is coupled to the third programming circuit. Furthermore, the current mirror 310 is coupled to a voltage terminal 310e at Vcc. The reference circuit includes the resistor 320, the n-channel MOS transistor 330, the laser fuse 340 and the electrical fuse 350 which is coupled to the voltage terminal 385 at Vss. The reference circuit in the programmable hybrid fuse circuit 300 operates in the same manner as the reference circuit in the programmable hybrid fuse circuit 200 and therefore is not discussed in further detail here.

The first programming circuit includes the n-channel MOS transistor 360, the laser fuse 370 and the electrical fuse 380 which is coupled to the voltage terminal 385 at Vss. The second programming circuit includes the n-channel MOS transistor 361, the laser fuse 371 and the electrical fuse 380 which is coupled to the voltage terminal 385 at Vss. The third programming circuit includes the n-channel MOS transistor 362, the laser fuse 372 and the electrical fuse 382 which is coupled to the voltage terminal 385 at Vss.

Furthermore, node 390 of the first programming circuit is coupled to the inverter 395 which provides the output signal $V_{out1}$, node 391 is coupled to the inverter 396 which provides the output signal $V_{out2}$, and node 392 is coupled to the inverter 397 which provides the output signal $V_{out3}$. The three programming circuits in the programmable hybrid fuse circuit 300 operate in the same manner as the programming circuit in the programmable hybrid fuse circuit 200 and therefore does not require further discussion here.

By providing three output voltage signals $V_{out1}$, $V_{out2}$, and $V_{out3}$, the programmable hybrid fuse circuit 300 generates three digital output signals which may be used in a number of different applications. For example, the three output voltage signals $V_{out1}$, $V_{out2}$, and $V_{out3}$ are used to provide the input signals to a digital-to-analog converter (DAC) to generate a plurality of analog output voltage signals which can be used to adjust the performance of an integrated circuit.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regard in an illustrative rather than a restrictive sense.

What is claimed is:

1. An apparatus for programming a hybrid fuse circuit comprising:
    a reference circuit for generating a reference current;
    a current mirror having reference input and at least one current output,
        wherein said reference input is coupled to said reference circuit, and said current mirror generates an output current for each of said at least one current output in response to said reference current; and
    a programming circuit coupled to each of said at least one current output of said current mirror to receive said output current generated by said current mirror, said programming circuit including,
        an output, and
        a laser fuse and an electrical fuse coupled in a serial order,
        wherein one of said laser fuse and said electrical fuse is capable of being blown during programming, and said programming circuit generates an output signal having a first voltage level or a second voltage level dependent on whether one of said laser fuse and said electrical fuse is blown.

2. The apparatus of claim 1, wherein said reference circuit comprises:
    a voltage terminal;
    a resistor, a reference transistor, a reference laser fuse and a reference electrical fuse coupled in a serial order;
    wherein said reference input of said current mirror is coupled to said reference transistor via said resistor, and said reference transistor is further coupled to said voltage terminal via said serially coupled reference laser fuse and reference electrical fuse.

3. The apparatus of claim 1, wherein said output current generated by said current mirror is equivalent to two times said reference current.

4. The apparatus of claim 1, wherein said current mirror comprises:
    voltage terminal;
    a first and a second transistor each having first, second and third terminals;
    wherein said first terminals of said first and second transistors are coupled to said voltage terminal, said second and third terminals of said first transistor are coupled to said reference input of said current mirror and to said second terminal of said second transistor, said third terminal of said second transistor is coupled to one of said at least one current output of said current mirror.

5. The apparatus of claim 2, said programming circuit further comprising:
    a transistor coupled with said electrical fuse and said laser fuse in a serial order;
    wherein one of said at least one current output of said current mirror is coupled to said transistor, said transistor is further coupled to said voltage terminal of said reference circuit via said serially coupled electrical fuse and laser fuse.

6. The apparatus of claim 5, further comprising:
    at least one inverter, having an input and an output, for inverting said first and second voltage levels;
    wherein each of said at least one current output of said current mirror is coupled to said output of said programming circuit and said input of said inverter.

7. The apparatus of claim 5, wherein said reference transistor and said transistor have identical sizes, said reference electrical fuse and said electrical fuse have identical resistive values, and said reference laser fuse and said laser fuse have identical resistive values.

8. The apparatus of claim 5, wherein said programming circuit further comprises:
    a programming input, a first input, and a second input;
    wherein during programming of said hybrid fuse circuit, said programming input is coupled to a programming signal via a first pad, said first input is coupled to said voltage terminal of said reference circuit via a second pad, and said second input is coupled to said voltage terminal of said reference circuit via a third pad such that when said programming signal is at a programming voltage level said electrical fuse is blown.

9. The apparatus of claim 5, wherein said laser fuse is blown by a applying a laser beam to said laser fuse.

10. The apparatus of claim 1, wherein said first voltage level is a logical "0" when one of said laser fuse and said electrical fuse is blown and said second voltage level is a logical "1" when both said laser fuse and said electrical fuse are left intact.

11. The apparatus of claim 4, wherein said voltage terminal of said current mirror is at Vcc.

12. The apparatus of claim 5, wherein said voltage terminal of said reference circuit is at Vss.

13. A programmable hybrid fuse circuit comprising:
    at least one programming circuit having an output, including,
        a voltage terminal,
        a laser fuse,
        an electrical fuse serially coupled to said laser fuse such that during programming one of said laser fuse and said electrical fuse is broken,
        a transistor coupled to said output of said at least one programming circuit and further coupled to said voltage terminal via said serially coupled electrical fuse and laser fuse; and
    a reference circuit for generating a reference current to a reference output terminal, including,
        a resistor, a reference transistor, a reference laser fuse and a reference electrical fuse-coupled serially, and said reference output terminal coupled to said reference transistor via said resistor, said reference transistor further coupled to said transistor and said voltage terminal of each said at least one programming circuit via said serially coupled reference laser fuse and reference electrical fuse;

wherein said at least one programming circuit generates an output signal having a first voltage level or a second voltage level dependent on whether one of said laser fuse and said electrical fuse is broken.

14. The programmable hybrid fuse circuit of claim 13, wherein the at least one programming circuit further comprises:

an inverter coupled to said transistor.

15. The programmable hybrid fuse circuit of claim 13, further comprising:

a current mirror having a reference input and at least one current output;

wherein said reference input is coupled to said reference output of said reference circuit and each said at least one current output is coupled to each said output of each said at least one programming circuit, and said current mirror generates an output current for each said at least one current output in response to said reference current.

16. The programmable hybrid fuse circuit of claim 15, wherein said reference transistor and said transistor have identical sizes, said reference electrical fuse and said electrical fuse have identical resistive values, and said reference laser fuse and said laser fuse have identical resistive values.

17. The programmable hybrid fuse circuit of claim 16, wherein said first voltage level is a logical "0" when one of said laser fuse and said electrical fuse is broken, and said second voltage level is a logical "1" when both said laser fuse and said electrical fuse are left intact.

18. The programmable hybrid fuse circuit of claim 13, wherein said voltage terminal is at Vss.

19. A method of programming a hybrid fuse circuit comprising the steps of:

(a) generating a reference current;

(b) generating an output current in response to said reference current;

(c) programming one of a laser fuse and a electrical fuse, including the steps of, (1) applying a laser beam directly to said laser fuse, or (2) coupling one end of said electrical fuse to a first voltage terminal via a first pad and applying an electrical signal to the other end of said electrical fuse via a second pad; and (d) generating an output signal indicative of whether one of said electrical fuse or said laser fuse is programmed and in response to said output current, including the steps of, (1) providing said output current to an input of a programming circuit, (2) increasing a voltage at a programming input of said programming circuit, and (3) generating a first voltage level at a logical "0" when one of said laser fuse and said electrical fuse is programmed, and a second voltage level at a logical "1" when both said laser fuse and said electrical fuse are not programmed in response to said output current.

* * * * *